United States Patent [19]

Banerjee et al.

[11] Patent Number: 5,734,559
[45] Date of Patent: Mar. 31, 1998

[54] STAGGERED BOND FINGER DESIGN FOR FINE PITCH INTEGRATED CIRCUIT PACKAGES

[75] Inventors: Koushik Banerjee, Chandler; Robert J. Chroneos, Jr., Tempe, both of Ariz.

[73] Assignee: Intel Corporation, Santa Clara, Calif.

[21] Appl. No.: 626,233

[22] Filed: Mar. 29, 1996

[51] Int. Cl.$^6$ ..................................................... H05K 1/11
[52] U.S. Cl. ................ 361/761; 361/760; 361/764; 361/772; 174/52.4; 257/723; 257/724; 257/777; 257/784
[58] Field of Search ......................... 361/761, 760, 361/767, 772, 777, 764, 763, 762; 174/52.4; 257/723, 724, 678, 786, 784, 777

[56] References Cited

U.S. PATENT DOCUMENTS 5,468,999 11/1995 Lin et al. ............................ 257/784

Primary Examiner—Leo P. Picard
Assistant Examiner—David Foster
Attorney, Agent, or Firm—Blakely, Sokoloff, Taylor & Zafman

[57] ABSTRACT

An integrated circuit package which has a plurality of bond fingers arranged in a staggered row arrangement on a bond shelf of the package. The bond shelf contains a first row of bond fingers that are separated by a plurality of spaces. The bond shelf also has a second row of bond fingers which each have a bond pad and a lead trace that extends through the spaces of the first row of bond fingers.

4 Claims, 1 Drawing Sheet

5,734,559

STAGGERED BOND FINGER DESIGN FOR FINE PITCH INTEGRATED CIRCUIT PACKAGES

BACKGROUND OF THE INVENTION

1. Field of the Invention

The present invention relates to a package for an integrated circuit.

2. Description of Related Art

Integrated circuits are typically housed within plastic or ceramic packages. The packages have a plurality of external contacts that are coupled to a printed circuit board. The package further contains internal routing that electrically couples the contacts with a plurality of internal bond fingers. The bond fingers are typically located on one or more bond shelves of the package.

FIG. 1 shows a plurality of bond fingers 2 located on two separate bond shelves of a conventional package 4. The bond fingers 2 are coupled to the die pads 6 of an integrated circuit 8 by a plurality of bond wires 10. The bond wires 10 are typically applied with automated bonding machines.

To accommodate tolerances in the package and the automated bonding equipment, it is desirable to provide a bond finger that is wider than the diameter of the wire. The wider fingers insure that the wire is placed onto the surface of the fingers by the bonding equipment. The width of the bond fingers is limited by the die pad pitch and the metal to metal spacing that separate the fingers.

Highly functional integrated circuits such as microprocessors require a relatively large number of pins. Microprocessors designed with more functions typically require more pins. It is desirable to package a larger microprocessor without increasing the outer dimensions of the package and the footprint of the external printed circuit board. Providing more pins within the same space requirements typically requires a reduction in the width of the bond fingers. The reduction in bond finger width may reduce the manufacturing yield of the package. It would therefore be desirable to provide a bond finger pattern that accommodates a smaller pitch without reducing the width of the fingers.

SUMMARY OF THE INVENTION

The present invention is an integrated circuit package which has a plurality of bond fingers arranged in a staggered row arrangement on a bond shelf of the package. The bond shelf contains a first row of bond fingers that are separated by a plurality of spaces. The bond shelf also has a second row of bond fingers which each have a bond pad and a lead trace that extends through the spaces of the first row of bond fingers.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 2:
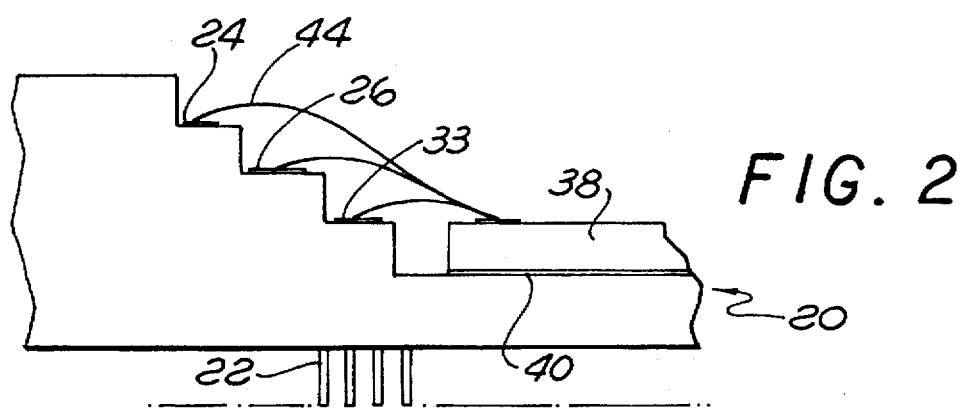
FIG. 2 is a side cross-sectional view of an integrated circuit package of the present invention.
Figure 3:
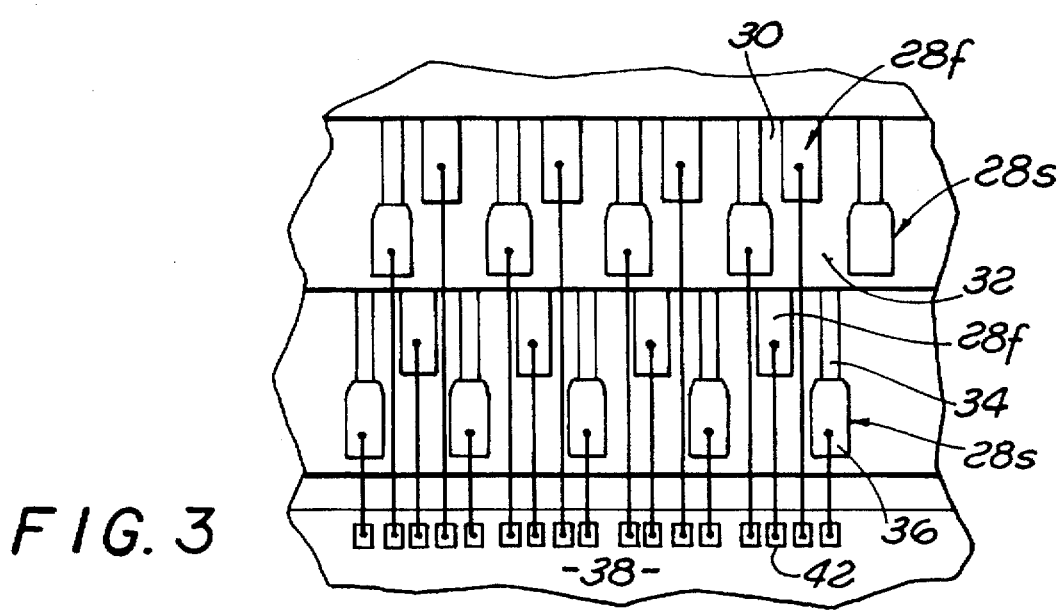
FIG. 3 is a top view of a bond shelf of the integrated circuit package of FIG. 2.

Referring to the drawings more particularly by reference numbers, FIGS. 2 and 3 show an integrated circuit package 20 of the present invention. The package 20 may have a plurality of pins 22 that are coupled to an external printed circuit board (not shown). Although a pin grid array (PGA) package is shown and described, it is to be understood that the bus pattern of the present invention may be used in ball grid array (BGA) and land grid array (LGA) packages.

The package 20 may have a pair of bond shelves 24 and 26 which contain a plurality of bond fingers 28f and 28s. The shelves each have a first row of bond fingers 28f and a second row of bond fingers 28s. The bond fingers 28f of the first row are separated by spaces 30 of dielectric material. The bond fingers 28s of the second row are separated by spaces 32. The package 20 may have a third bond shelf 33 which has power and ground busses (not shown).

Each bond finger 28s in the second row has a lead trace 34 that extends from a bond pad 36. The lead traces 34 are routed through the spaces 32 that separate the bond fingers 28f of the first row. The width of the lead traces 34 is less than the width of the bond pads 36. This relationship ensures that there is adequate dielectric spacing between the second bond fingers 28s, while providing a relatively large bond pad area. The width of the first row of bond fingers 28f is typically the same as the width of the bond pads 36.

An integrated circuit die 38 is mounted to a die mounting area 40 of the package 20. The die could also be mounted on a heat slug. Alternatively, the die 38 can be mounted directly to a heat slug (not shown) attached to the package 20. The integrated circuit 38 has a plurality of die pads 42 located about the periphery of the die 38. The die pads 42 are coupled to the bond fingers 28f and 28s by a plurality of bond wires 44. The bond wires 44 are typically applied with automated bonding equipment. The width of the bond fingers 28 compensates for conventional manufacturing tolerances in the package and the automated bonding equipment so that the wires 44 are always bonded to the surface of the fingers.

Figure 1:
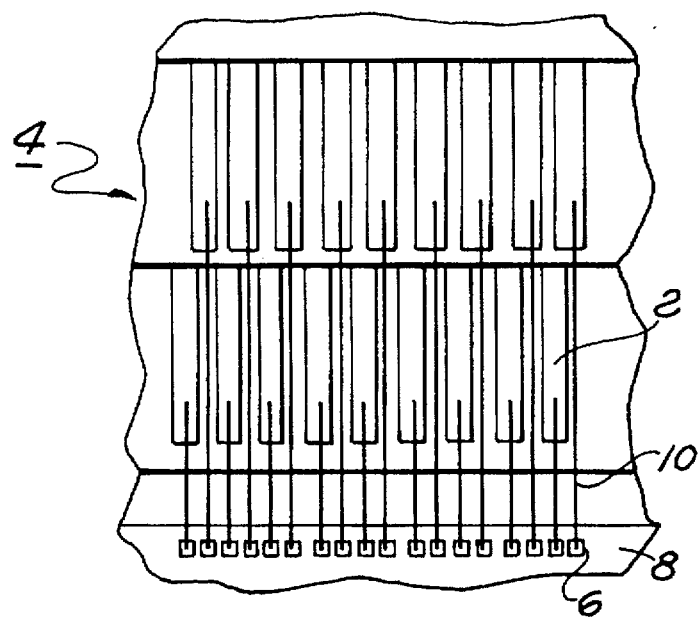
FIG. 1 is a top view of a bond shelf of an integrated circuit package of the prior art.

The staggered relationship of the pads provides a maximum finger width for a given die pad pitch. The staggered pattern effectively reduces the metal to metal spacing between two adjacent bond fingers of the prior art from the uniform pattern shown in FIG. 1. The staggered pattern can therefore provide a greater finger width for a given die pad pitch than the non-staggered bond finger patterns of the prior art. Table I provides a comparison between a conventional non-staggered bond finger pattern and the staggered bond finger pattern of the present invention. The die pad pitch is defined as the space between each adjacent die pad 42 on the integrated circuit. The bond finger width is computed by doubling the die pad pitch and subtracting the bond finger spacing between adjacent bond fingers in the first and second rows. All values are in microns.

| BOND PAD PITCH | BOND FINGER WIDTH (PRIOR ART) | BOND FINGER WIDTH (PRESENT INVENTION) |
| --- | --- | --- |
| 100 | 150 | 167 |
| 85 | 120 | 137 |
| 80 | 110 | 127 |

The bond fingers 28f and 28s are routed to the pins 22 by internal routing within the package 20 to electrically couple the pins 22 to the integrated circuit 42. The package 20 can be constructed with conventional printed circuit board, or co-fired ceramic, processes. The bond fingers 28f and 28s are typically formed by conventional plating and etching processes.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package, comprising:

a package which has a plurality of separated bond fingers located on a first bonding shelf and a second bonding shelf, each bonding shelf having said bond fingers arranged in a first row and a second row, said second row of bond fingers each having a lead trace which extends from a bond pad, said lead traces extend through a plurality of spaces that separate said bond fingers of said first row, wherein said bond fingers of said first and second rows are arranged in a staggered pattern;

an integrated circuit mounted to said package, said integrated circuit having a plurality of die pads including a first die pad, a second die pad that is adjacent to said first die pad, a third die pad that is adjacent to said second die pad, and a fourth die pad that is adjacent to said third die pad; and, a plurality of bond wires that are attached to said bond fingers and said die pads, said bond wires attach said first die pad to said bond finger in said second row of said second bonding shelf, said second die pad to said bond finger in said first row of said first bonding shelf, said third die pad to said bond finger in said first row of said second bonding shelf and said fourth die pad to said bond finger in said second row of said first bonding shelf.

2. The package as recited in claim 1, wherein said first and second row of bond fingers are arranged in a rectangular pattern about said package.

3. The package as recited in claim 2, further comprising a plurality of contacts that are electrically coupled to said bond fingers.

4. A method for assembling an electronic package, comprising the steps of:

a) providing a package which has a plurality of separated bond fingers located on a first bonding shelf and a second bonding shelf, each bonding shelf having said bond fingers arranged in a first row and a second row, said second row of bond fingers each having a lead trace which extends from a bond pad, said lead traces extend through a plurality of spaces that separate said bond fingers of said first row, wherein said bond fingers of said first and second rows are arranged in a staggered pattern;

b) mounting an integrated circuit to said package, wherein said integrated circuit has a plurality of die pads including a first die pad, a second die pad that is adjacent to said first die pad, a third die pad that is adjacent to said second die pad, and a fourth die pad that is adjacent to said third die pad;

c) coupling said first die pad to said bond finger in said second row of said second bonding shelf;

d) coupling said second die pad to said bond finger in said first row of said first bonding shelf;

e) coupling said third die pad to said bond finger in said first row of said second bonding shelf; and, f) coupling said fourth die pad to said bond finger in said second row of said first bonding shelf.

* * * * *